United States Patent [19]
Pasqualini

[11] Patent Number: 6,160,428
[45] Date of Patent: Dec. 12, 2000

[54] UNIVERSAL ON-CHIP INITIALIZATION CIRCUIT

[75] Inventor: Ronald Pasqualini, Los Altos, Calif.

[73] Assignee: National Semiconductor Corporation, Santa Clara, Calif.

[21] Appl. No.: 09/209,641

[22] Filed: Dec. 10, 1998

[51] Int. Cl.[7] .................................................... H03L 7/00
[52] U.S. Cl. ............................................. 327/142; 327/143
[58] Field of Search ................................. 327/142, 143, 327/198, 205, 206

[56] References Cited

U.S. PATENT DOCUMENTS

| | | | |
|---|---|---|---|
| 4,607,178 | 8/1986 | Sugie et al. ............................. | 327/143 |
| 5,467,039 | 11/1995 | Bae ........................................ | 327/198 |
| 5,602,502 | 2/1997 | Jiang ...................................... | 327/143 |
| 5,847,586 | 12/1998 | Burstein et al. ....................... | 327/143 |
| 5,994,888 | 11/1999 | Yanagawa .............................. | 323/313 |

*Primary Examiner*—My-Trang Nuton
*Attorney, Agent, or Firm*—Beyer Weaver & Thomas, LLP

[57] ABSTRACT

An improved on-chip initialization circuit is described. This circuit can be used to automatically initialize integrated circuits during power-up, without the use of internal or external RC components. In one embodiment, the described initialization circuit can be used to generate the warm-up delay required by any crystal oscillator. In another embodiment, a test mode and test signals are provided which allow the on-chip initialization circuitry to be quickly tested.

17 Claims, 9 Drawing Sheets

Note:
QZ outputs are cleared to zero by active low 'resetz' input.
QZ outputs count up from zero.

UNIVERSAL ON-CHIP INITIALIZATION CIRCUIT

FIELD OF THE INVENTION

The present invention pertains to power-up initialization circuits for use in CMOS integrated circuits (CMOS ICs). More specifically, the present invention relates to a universal initialization circuit suitable for initializing the logic elements present in CMOS ICs. The initialization signal is compatible with crystal oscillator warm-up requirements and will persist until the VCC power supply has reached a voltage level high enough to support normal chip operation.

BACKGROUND OF THE INVENTION

CMOS ICs are usually powered by an external power supply which provides a VCC voltage suitable for normal chip operation. When the power supply is initially turned on, the VCC voltage rises and ultimately stabilizes at its specified DC operating value. The time interval during which this occurs is sometimes referred to as the "power-on reset interval" or the "cold initialization interval". All on-chip circuits connected to the power supply must be forced into their correctly initialized states during cold initialization. If these circuits are not properly initialized, they could generate false output signals during cold initialization, or even enter the wrong initialized state. Either or both of these possibilities can cause erratic system behavior and, in some cases, can cause system failure.

In a typical application the dc power supply voltage (VCC) is derived from the AC line. In such applications the cold initialization interval cannot be less than 4 ms (¼ cycle of the 60 HZ AC line). However, depending upon the risetime specifications of the VCC power supply, the cold initialization interval can last much longer.

If the system includes a crystal oscillator, the cold initialization interval must be extended until the crystal warm-up time has elapsed (i.e. the crystal has begun to oscillate at the correct frequency). Since the crystal warm-up time is relatively long (25 ms–250 ms), it is infeasible to utilize an on-chip RC time constant to generate the required crystal warm-up delay. In order to illustrate this point, let us assume a maximum 'practical' on-chip capacitor value of 100 pf. (This capacitor value is limited by the chip area consumed by the capacitor; larger capacitors consume additional chip area). In order to generate a 250 ms crystal warm-up delay, a 2500 Megohm resistor would be required. Assuming a 'typical' Nwell resistance of 1.5 Kohms/square, this 2500 Megohm resistor would require approximately 1.7 million squares of N-well. These squares would occupy a chip area which is intolerably large. Additionally, the resistor current would not be reliable because it would be extremely small (approximately 1.3 nA at 3.3v). In summary, if the crystal warm-up delay is to be generated on-chip, the on-chip initialization circuit cannot use an RC time constant in order to generate the warm-up delay.

During cold initialization the VCC voltage ramps up from zero volts to its final dc value. Thus, during most of the cold initialization interval, the on-chip initialization circuit must operate in the absence of a fully 'valid' VCC voltage. This constraint makes it virtually impossible to employ 'standard' analog circuitry such as comparators, Schmitt triggers, etc.

In terms of flexibility, many of the prior art initialization circuits have proven inadequate, due to one or more of the following limitations:

1) They employ an on-chip RC (resistor/capacitor) time constant which provides inadequate crystal warm-up time;
2) They fail to respond to fast power supply risetimes, such as those found in battery powered applications;
3) They do not provide a short test time for the crystal warm-up delay;
4) They are not filly ratiometric to the VCC power supply voltage (i.e. their response depends upon the risetime of VCC, instead of depending only upon the VCC voltage value);
5) They may not operate correctly when the VCC risetime is extremely slow or extremely fast;
6) They provide an initialization signal which is not robust (i.e. the initialization signal is removed when the VCC voltage is fairly low—in the worst case, barely more than the sum of the PMOS threshold and the NMOS threshold);
7) Their VCC trip point varies widely with PT (process/temperature) variations;
8) They employ non-CMOS structures, such as depletion devices, or
9) They are excessively complex.

In view of the foregoing limitations, it should be apparent that an improved on-chip initialization circuit would be highly desirable.

SUMMARY OF THE INVENTION

An improved on-chip initialization circuit is described. More specifically, this initialization circuit includes a trigger circuit capable of providing an initialization signal to the state-dependent elements (flipflops) of a CMOS integrated circuit. Since the initialization circuit is located on-chip, it completely eliminates the need for external initialization components such as resistors, capacitors and Schmitt triggers. In some applications it can also eliminate the need for a chip initialization (reset) pin.

In one embodiment of the invention, a trigger circuit is disclosed. This circuit is arranged to provide an active low initialization output signal based upon the voltage level present on the VCC power supply. When plotted as a function of VCC, the initialization output signal remains in its active low state until a predetermined VCC trip point voltage has been reached. When the VCC voltage exceeds the VCC trip point, the initialization output signal rapidly increases from its active low state to its inactive high state (which is equal to VCC). Thus the initialization signal is fully ratiometric to VCC—i.e. it only depends upon the VCC value, not upon the VCC ramp rate (risetime).

The trigger circuit includes a first voltage signal generator connected between VCC and ground. When the output from the first signal generator is plotted as a function of VCC, the resulting transfer function is represented by a linear ramp whose slope is typically set equal to ⅓.

The trigger circuit also includes a second voltage signal generator connected between VCC and ground. The input to the second signal generator is driven by the output from the first signal generator. Thus, when the output of the second signal generator is plotted as a function of VCC, the resulting transfer function is represented by an approximately linear ramp whose slope is greater than the linear ramp present at the output from the first signal generator.

The trigger circuit also includes an initialization voltage signal generator connected between VCC and ground. The input to the initialization voltage signal generator is driven by the output from the second signal generator. Thus, when the output of the initialization signal generator is plotted as a function of VCC, the resulting transfer function is represented by an "S" shaped curve whose vertical portion has a very steep slope. The VCC voltage at which this steep slope occurs is called the 'VCC trip point'.

When the VCC voltage is low, the output from the initialization voltage signal generator is also low, generating the active low initialization signal. When the VCC voltage reaches the VCC trip point, the output from the initialization voltage signal generator rapidly increases so that it becomes equal to VCC. At this point the initialization signal becomes inactive high (i.e. equal to the VCC voltage value at the VCC trip point). Thus, as the VCC voltage further increases beyond the trip point, the output from the initialization voltage signal generator simply follows VCC.

Those skilled in the art will appreciate that the VCC voltage value at the VCC trip point is critical. If the VCC trip point is set too low, the initialization signal will be removed 'too early' (i.e. while the VCC voltage is still at a relatively low value). This early removal of the initialization signal can result in improper initialization, causing erratic system behavior and, in some cases, system failure.

On the other hand, if the VCC trip point is set too high (too close to the minimum dc operating value for VCC), the initialization signal may never be removed, resulting in system failure.

In one implementation of the invention, an initialization circuit includes a trigger circuit and a counter circuit which provide a crystal warm-up delay by counting valid clock pulses. By way of example, a 24 bit counter circuit driven by a 50 MHz clock can provide a crystal warm-up delay equal to 160 ms.

In another embodiment of the invention, an initialization circuit is used to initialize a CMOS chip when the VCC risetime is extremely fast, such as in battery powered applications.

In a preferred embodiment of the invention, the need for an external reset package pin, external RC delay components and an external Schmitt trigger is eliminated. (A Schmitt trigger is often required in order to speed up the extremely slow risetime generated by external RC delay components). The described invention can be utilized by any CMOS circuit employing an external dc power supply whose power source can originate from the 60 HZ AC line or from an external battery.

BRIEF DESCRIPTION OF THE DRAWINGS

The present invention is illustrated by way of example, and not by way of limitation, in the figures and accompanying drawings in which like-reference numerals refer to similar elements.

DETAILED DESCRIPTION OF THE PREFERRED EMBODIMENTS

In describing the invention, numerous specific embodiments are set forth in order to provide a thorough understanding of the invention. However, as will be apparent to those skilled in the art, the invention may be practiced without these specific details or by utilizing alternate elements or processes. In other instances, well known processes, procedures, components and circuits have not been described in detail so as not to unnecessarily obscure aspects of the invention.

Figure 1:
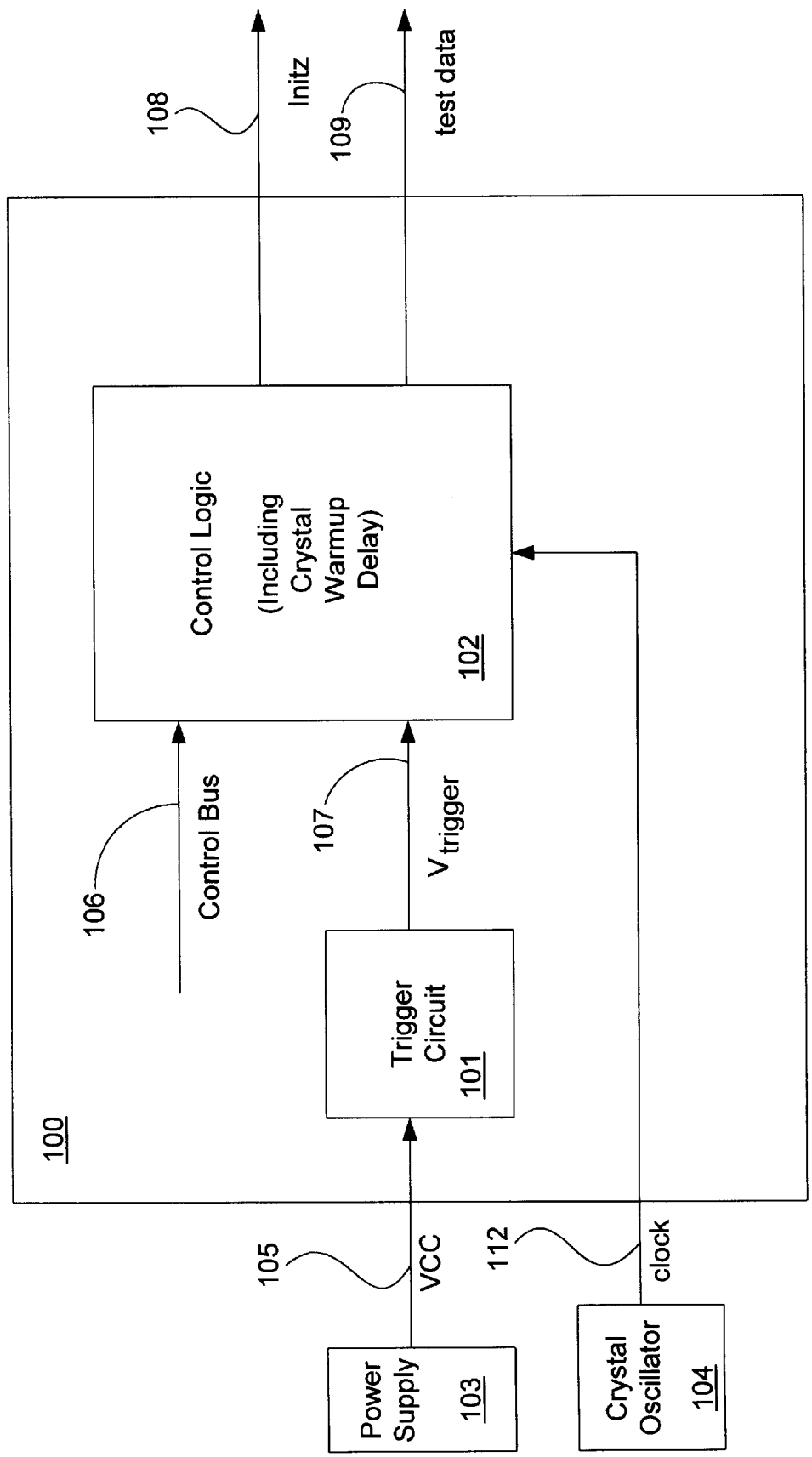
FIG. 1 is a block diagram of the invention.

FIG. 1 illustrates a block diagram of an initialization circuit 100 in accordance with the present invention. It should be noted that, for the sake of clarity, the integrated circuit being initialized is not shown in FIG. 1.

The initialization circuit 100 includes a trigger circuit 101 having an input line 105 connected to an external power supply 103. The trigger circuit 101 generates an initialization voltage $V_{trigger}$ at output line 107, which is connected to a control logic block 102. The control logic block 102 is connected to external circuitry by way of a control bus 106 and by way of output signals 108 and 109.

As shown in FIG. 1, the chip containing initialization circuit 100 also contains an on-chip crystal oscillator 104. The warm-up delay required by crystal oscillator 104 is generated by control logic block 102.

Since the required crystal warm-up delay can be relatively long (approximately 25 ms to 250 ms), control logic block 102 includes a test data output 109 which allows the crystal warm-up delay circuit to be quickly tested. This is accomplished without increasing the normal operating speed of the crystal warm-up delay circuit.

Referring to FIG. 1, when the power supply is initially turned on, the VCC voltage 105 begins ramping up to its normal operating value. During this ramp-up interval trigger circuit 101 generates an active low initialization voltage $V_{trigger}$ on output line 107. Based upon inputs received from control bus 106, control logic block 102 utilizes the $V_{trigger}$ signal to generate a control output 'Initz' 108 which provides an active low initialization signal to the entire CMOS chip.

Figure 2:
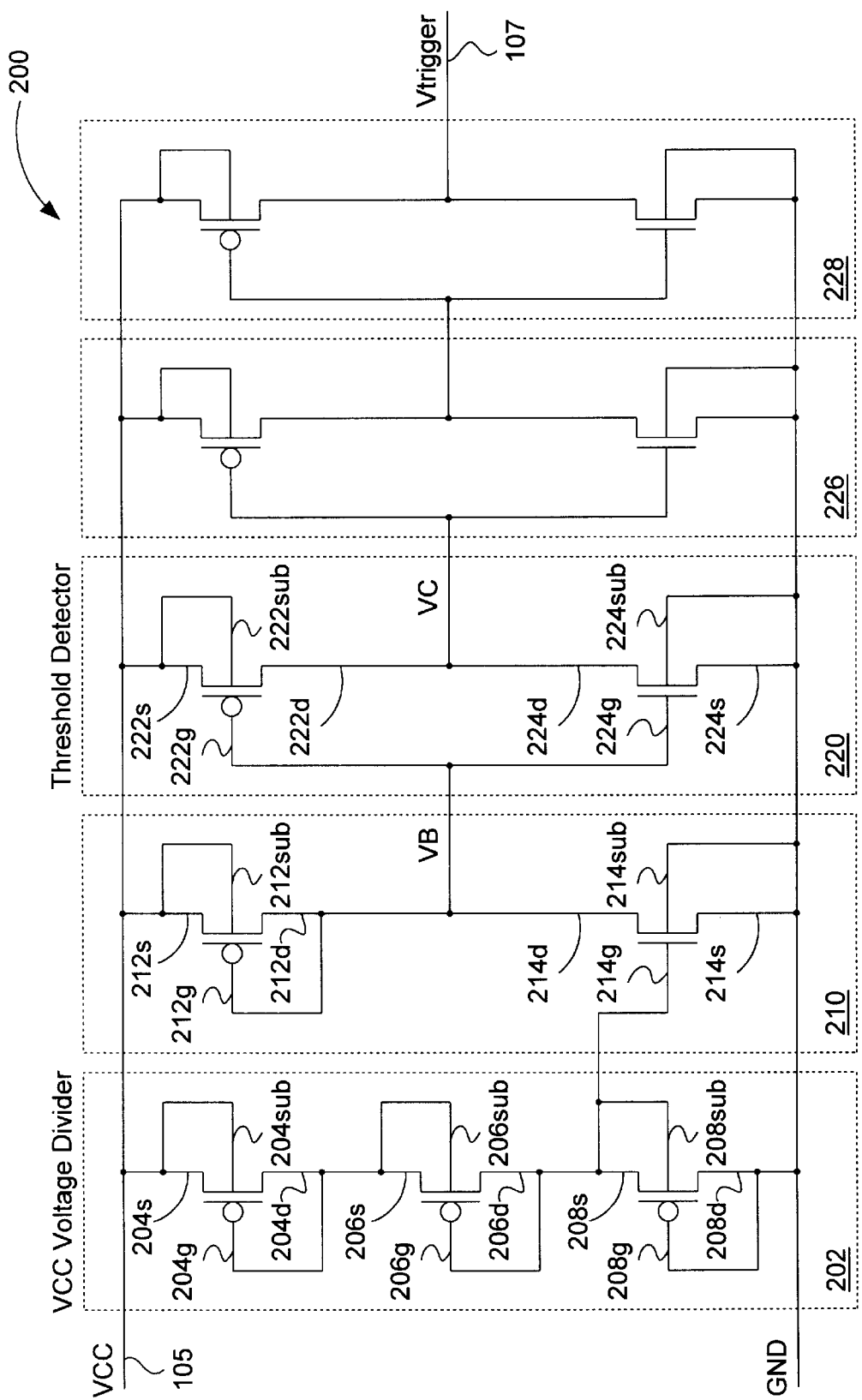
FIG. 2 is a schematic representation of a trigger circuit in accordance with an embodiment of the invention.
Figure 3:
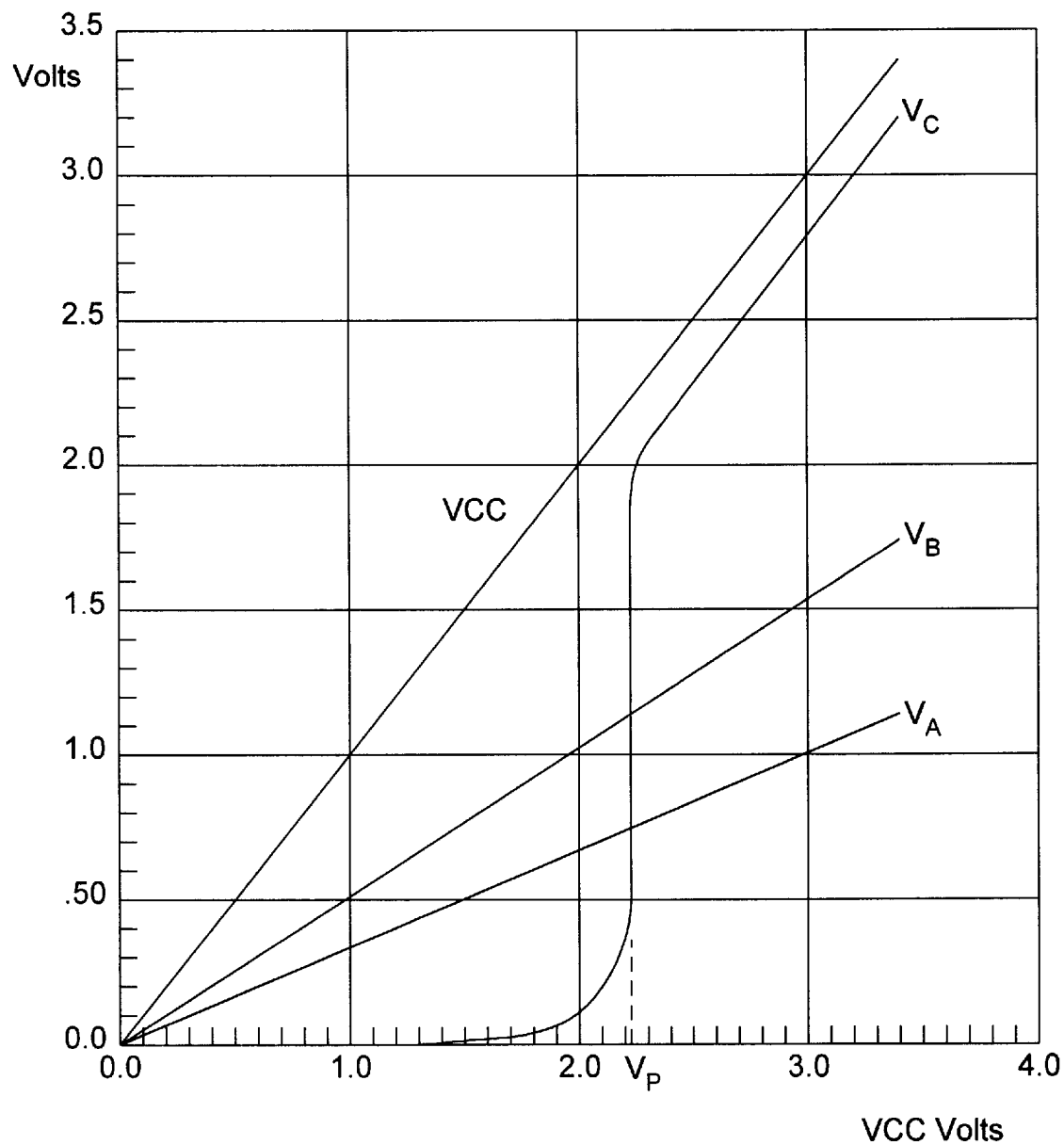
FIG. 3 is a graphical representation of relevant waveforms produced by the trigger circuit shown in FIG. 2.

The schematic representation of a trigger circuit 200 is shown in FIG. 2. It should be noted that trigger circuit 200 is but one possible embodiment of trigger circuit 101 shown in FIG. 1. FIG. 3 is a graphical representation of various waveforms generated by the sub-circuits contained in trigger circuit 200. Thus FIG. 3 will be referred to at various times in the discussion of trigger circuit 200 and its constituent sub-circuits.

Trigger circuit 200 includes a first voltage divider 202 connected between the VCC power supply line 105 and ground. In a preferred embodiment of the invention, the first voltage divider is formed from three transistors 204, 206 and 208 connected in series between VCC and ground. In a preferred implementation, transistors 204, 206 and 208 are PMOS transistors. Transistor 204 has a source 204s and a substrate 204sub connected to VCC. The gate 204g and drain 204d of transistor 204 are connected to the source 206s and substrate 206sub of transistor 206. Similarly, the gate 206g and drain 206d of transistor 206 are connected to the source 208s and substrate 208sub of transistor 208. Transistor 208 also has a gate 208g and a drain 208d which are connected to ground.

Since transistors 204, 206 and 208 have their source nodes connected to their substrates, these transistors will not exhibit any body effect. Thus transistors 204, 206 and 208 form a linear voltage divider between VCC and ground. Those skilled in the art will recognize that voltage $V_A$ in FIG. 2 will be equal to VCC/3. Thus, as VCC ramps up from zero volts to its normal operating value, voltage $V_A$ will ramp up from zero volts to VCC/3, for any given value of VCC. This behavior is illustrated in FIG. 3, which plots several different voltages as a function of VCC. As shown in FIG. 3, $V_A$ is a straight line which has a slope of exactly ⅓. (For reference purposes, the VCC voltage is also plotted in FIG. 3. Thus the curve labeled VCC is a straight line which has a slope that is substantially equal to 1).

Referring to FIG. 2, the voltage $V_A$ forms the input to a second voltage divider 210 connected between VCC and ground. In a preferred embodiment of the invention, the second voltage divider 210 is formed from PMOS transistor 212 connected in series with NMOS transistor 214. PMOS transistor 212, which acts as a load resistor, has its substrate 212sub and its source 212s connected to VCC input line 105. Thus PMOS transistor 212 does not exhibit any body effect. PMOS transistor 212 also has a gate 212g connected to a drain 212d and to drain 214d of NMOS transistor 214.

The width to length ratios of PMOS transistor 212 and NMOS transistor 214 must be carefully chosen so that the voltage $V_B$ in FIG. 2 will be close to VCC/2, for all values of VCC. Thus, as the VCC voltage increases from zero to its normal operating value, the output voltage $V_B$ from the second voltage divider 210 will approximate a linear function of VCC. This relationship is illustrated by the $V_B$ curve shown in FIG. 3.

As shown in FIG. 3, the ramp rate (slope) of the $V_B$ voltage is approximately equal to ½. Since the ramp rate (slope) of the VA voltage is equal to ⅓, the $V_B$ voltage will always be greater than or equal to the $V_A$ voltage. This relationship is required in order for the trigger circuit 200 to operate properly.

Again referring to FIG. 2, the voltage $V_B$ forms the input to a threshold detector circuit 220 consisting of PMOS transistor 222 and NMOS transistor 224. Thus the $V_B$ voltage is connected to the gate 222g of PMOS transistor 222, and to the gate 224g of NMOS transistor 224. In addition, the source 222s and substrate 222sub of PMOS transistor 222 are connected to the VCC power supply node 105. Furthermore, the drain 222d of PMOS transistor 222 is connected to the drain 224d of NMOS transistor 224, forming the threshold detector output voltage $V_C$. NMOS transistor 224 also has a source 224s and a substrate 224sub which are connected to ground.

In a preferred embodiment of the invention, the width to length ratios of PMOS transistor 222 and NMOS transistor 224 must be carefully chosen in order to properly set the trip point voltage $V_P$ of threshold detector 220. Those skilled in the art will appreciate that the trip point voltage $V_P$ can be set to any particular value by modifying the sizes and types of transistors 222 and 224.

The trip point voltage $V_P$ is a function of transistor W/L ratios, process variations and temperature variations. Thus $V_{PMAX}$, the maximum value of $V_P$, must be set to a value below $VCC_{MIN}$, the minimum operating value of VCC. This condition is required in order to ensure that all voltage values in the normal VCC operating range will cause the trip point $V_P$ to be reached during cold initialization.

Similarly, $V_{PMIN}$, the minimum value of $V_P$, must be set to a value which is high enough to ensure that all flipflop elements and gate elements will be properly initialized. If $V_{PMIN}$ is set too low, the active low output voltage from threshold detector 220 will become inactive high before VCC has reached a value high enough to support normal circuit operation. This can cause erratic initialization of on-chip circuitry, causing improper chip operation.

As shown in FIG. 3, the output voltage $V_C$ in FIG. 2 remains in its active low state until VCC increases to a value which is equal to the trip point voltage $V_P$. When VCC exceeds the trip point $V_P$, the $V_C$ voltage quickly increases to its inactive high state, following any further increases in VCC.

Figure 4:
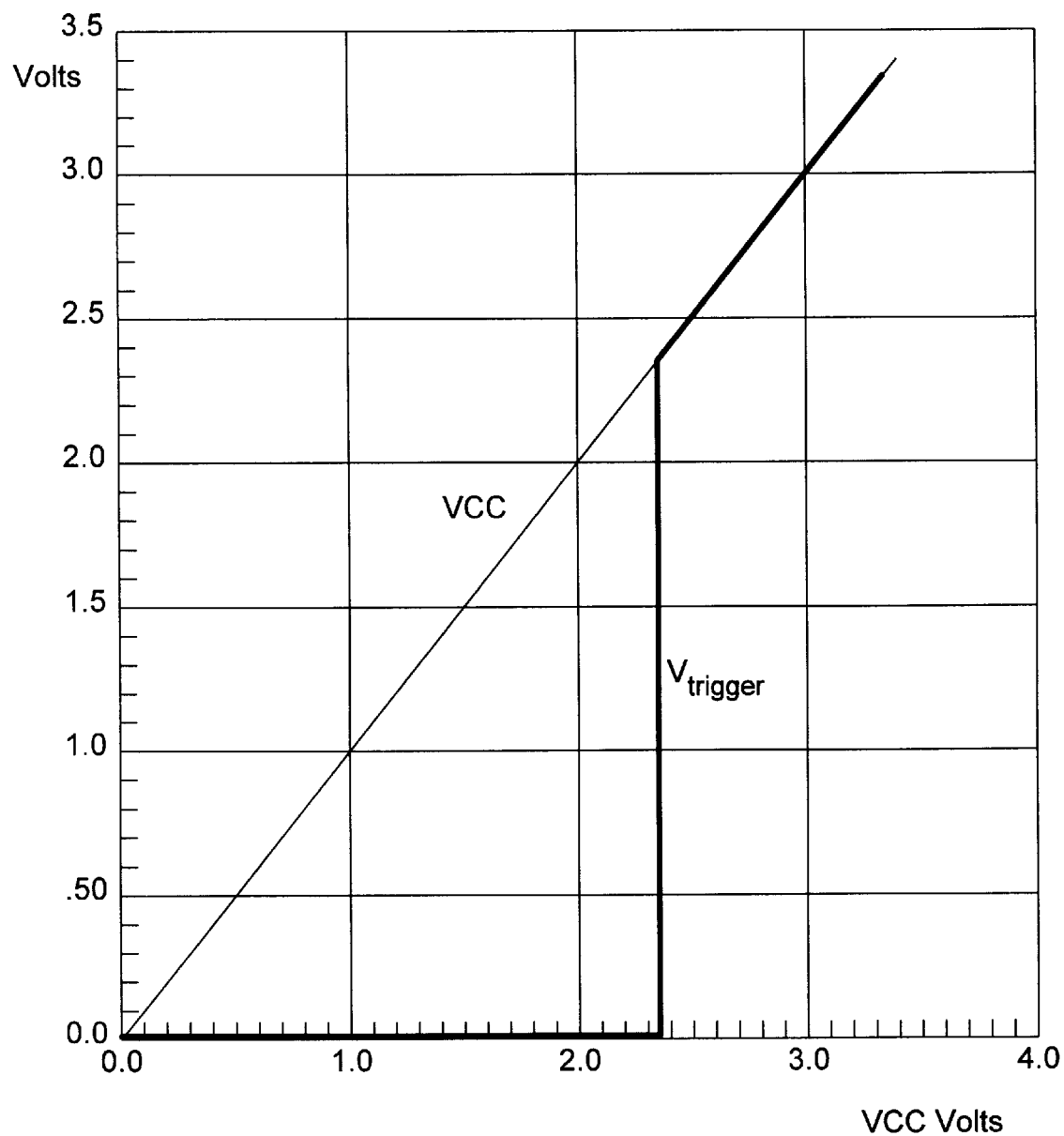
FIG. 4 is a graphical representation of the low frequency response of the trigger circuit shown in FIG. 2.

As shown in FIG. 2, one embodiment of the invention includes inverting amplifiers 226 and 228 which "square up" the $V_C$ voltage waveform. Thus these amplifiers transform the $V_C$ voltage curve shown in FIG. 3 into the nearly 'ideal' $V_{trigger}$ voltage curve shown in FIG. 4. Those skilled in the art will appreciate that these amplifiers increase the voltage gain (slope) at the trip point $V_P$, improving circuit performance. They will also appreciate that trigger circuit 200 is fully ratiometric with respect to the power supply input voltage VCC. Thus trigger circuit 200 can be readily configured to initialize a wide variety of CMOS integrated circuits.

In the following discussion, any reference to 'fast' or 'strong' transistors, as opposed to 'slow' or 'weak' transistors, refers to the range of performance characteristics that can be expected due to normal fabrication process variations. By way of example, a fast or strong transistor would exhibit a relatively high saturation current under a given set of operating conditions, whereas a slow or weak transistor would exhibit a low saturation current under the same operating conditions.

Figure 5:
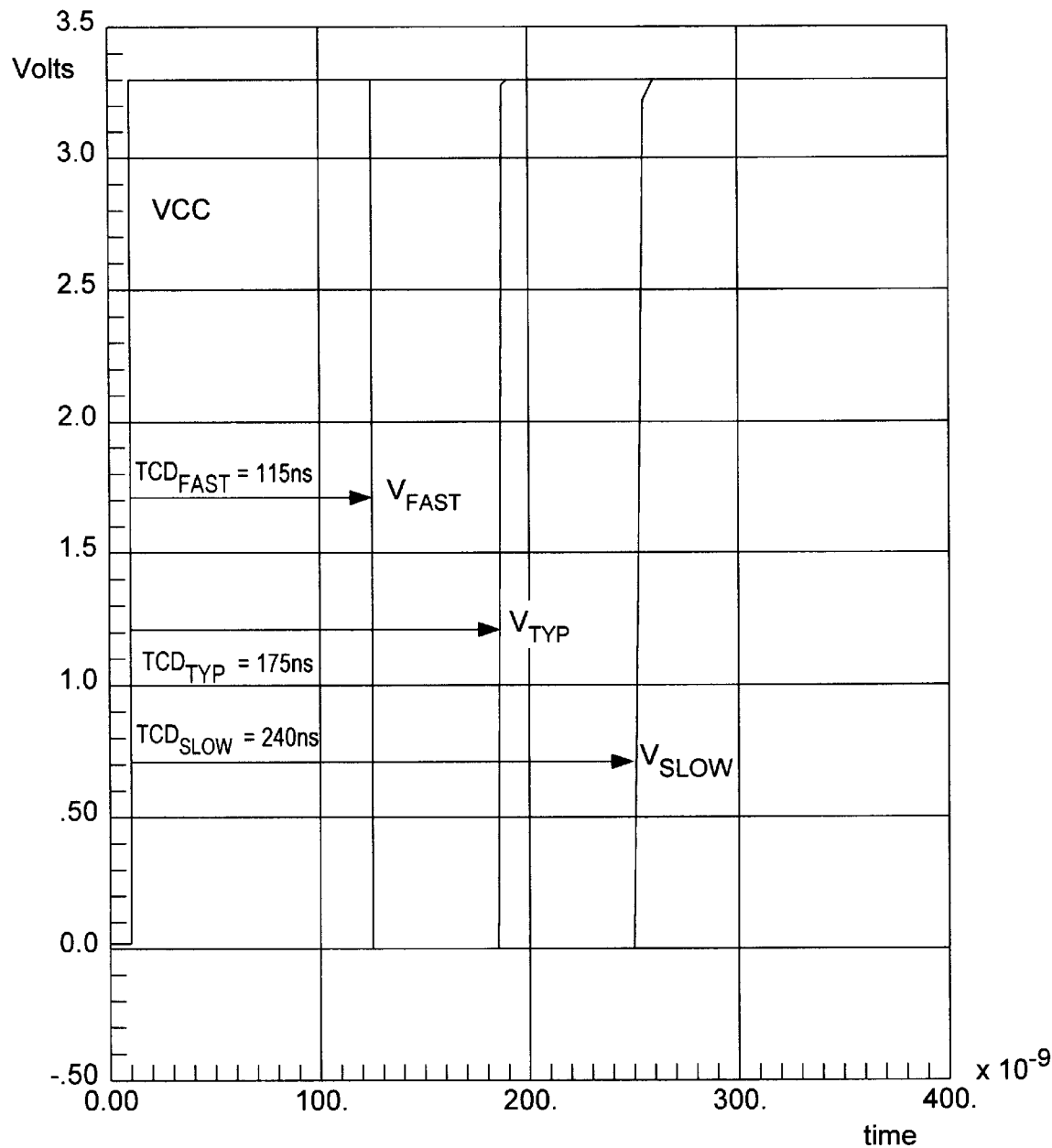
FIG. 5 is a graphical representation of the high frequency response of the trigger circuit shown in FIG. 2.

FIG. 5 shows the time response of circuit 200, under various operating conditions, to a step in the VCC input voltage. It should be noted that the VCC step response shown in FIG. 5 is exemplary in nature, and as such should not be considered limiting.

The "x" axis shown in FIG. 5 is "TIME" incremented in nanoseconds ($10^{-9}$). The "y" axis contains four voltage waveforms plotted as a function of time. The leftmost waveform, labeled 'VCC', represents a VCC voltage step input to trigger circuit 200 (simulating the fastest possible VCC risetime). The remaining three waveforms, labeled $V_{FAST}$, $V_{TYP}$ and $V_{SLOW}$, represent the $V_{trigger}$ output voltage from trigger circuit 200, under three different conditions of process and temperature. Thus the $V_{FAST}$ waveform applies under the conditions of fast process, low temperature; the $V_{TYP}$ waveform applies under the conditions of typical process, typical temperature; and the $V_{SLOW}$ waveform applies under conditions of slow process, high temperature.

As shown in FIG. 5, the response at the $V_{trigger}$ output is essentially equal to a delayed version of the step input voltage VCC. The amount of delay, $T_{CD}$, depends upon process variations and temperature. Thus, as shown in FIG. 5, the minimum circuit delay $T_{CDFAST}$=115 ns occurs under the conditions of fast transistors and low (0° C.) temperature. The typical circuit delay $T_{CDTYP}$=175 ns occurs under the conditions of typical transistors and typical (27° C.) temperature. Similarly, the maximum circuit delay, $T_{CDSLOW}$=240 ns occurs under the conditions of slow transistors and high (125° C) temperature.

The output waveforms shown in FIG. 5 indicate that trigger circuit 200 can successfully respond to fast changes in the VCC input voltage, under a wide variety of operating conditions. Those skilled in the art will therefore appreciate that trigger circuit 200 is suitable for use in all battery powered applications employing fast-switching FET turn-on devices.

Figure 6:
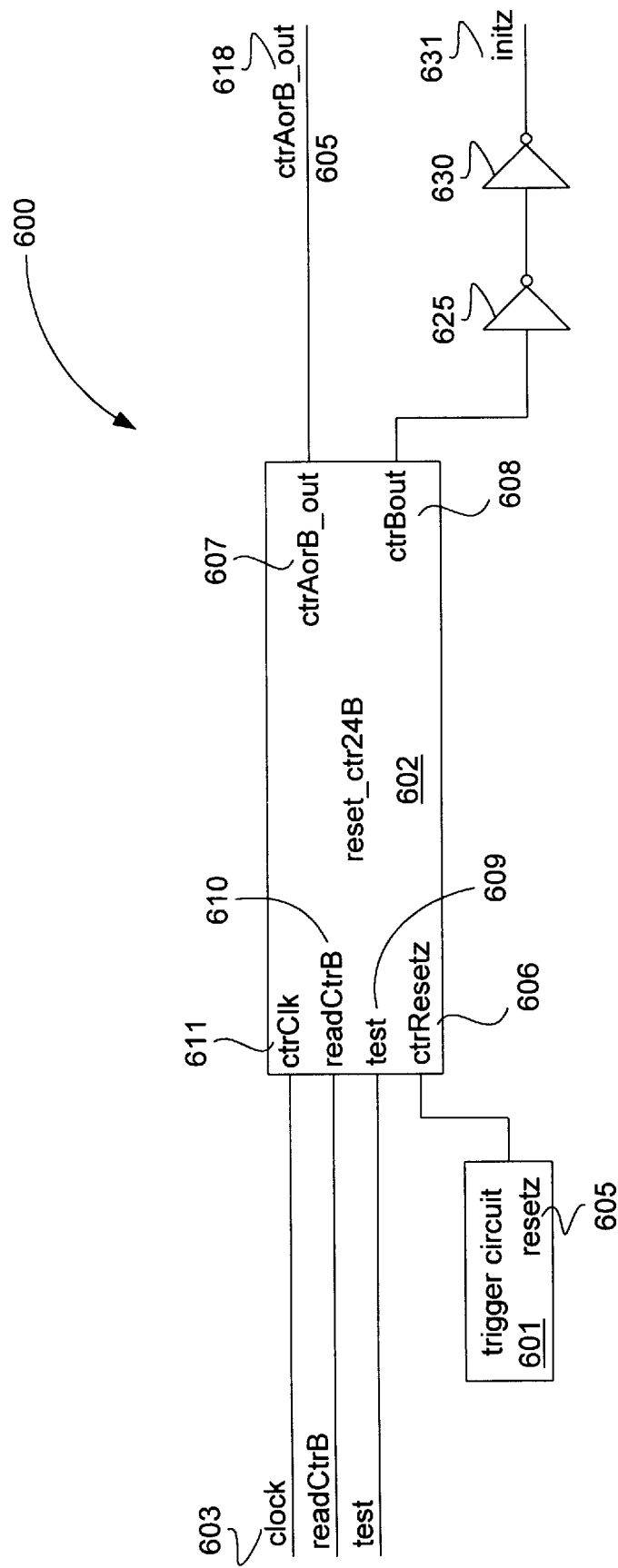
FIG. 6 is a schematic representation of a crystal warm-up circuit in accordance with an embodiment of the invention.

FIG. 6 is a schematic representation of a power-on initialization circuit 600 in accordance with an embodiment of the present invention. It should be noted that initialization circuit 600 is but one of the many possible embodiments of power-on initialization circuit 100 shown in FIG. 1. As shown in FIG. 6, initialization circuit 600 includes a 24 bit counter 602 which is used to generate the required crystal warm-up delay. The crystal warm-up delay is generated by counting clock pulses 603 produced by a crystal oscillator circuit (which is not shown).

Counter 602 contains an active low input pin 606, 'ctrResetz', which asynchronously resets all counter stages to zero. As shown in FIG. 6, ctrResetz pin 606 is driven by the active low 'resetz' output 605 from trigger circuit 601. In some implementations, trigger circuit 601 is identical to trigger circuit 200 shown in FIG. 2. Furthermore, in some implementations the 'resetz' pin 605 of trigger circuit 601 is identical to the $V_{trigger}$ signal produced by trigger circuit 200 shown in FIG. 2.

Referring to FIG. 6, the resetz pin 605 of trigger circuit 601 will remain low until VCC has reached its minimum operating value. Furthermore, while resetz pin 605 is low, counter 602 will be held in its reset state, preventing it from counting clock pulses. After VCC has reached its minimum operating value, resetz pin 605 of trigger circuit 601 will go high, enabling counter 602 to count clock pulses. Thus the output from the last stage of counter 602, 'ctrBout' 608, will remain low until the counter has counted $2^{23}$ clock pulses, at which time it will go high. Assuming a 50 Mhz clock, the crystal warm-up delay shown in FIG. 6 will be equal to $Tw_{warmUpDelay}=(1/50 \text{ Mhz})*(2^{23})=160$ msec.

As shown in FIG. 6, 'ctrBout' 608, the last stage output from counter 602, drives buffer inverter 625 which in turn drives buffer inverter 630. The active low 'initz' output 631 from buffer inverter 630 can be used to initialize an entire CMOS chip.

Those skilled in the art will appreciate that the number of bits contained in counter 602 can be readily adjusted in order to accommodate any required crystal warm-up delay and/or any given clock rate. They will also appreciate that counter 602 effectively acts as a VCC 'glitch filter'. Thus, when VCC does not monotonically increase from zero to its normal operating value, any low going 'glitches' in VCC will be filtered out because they will cause the 'resetz' output 605 from trigger circuit 601 to go low, resetting counter 602 to the all zeros state. This effectively restarts the crystal warm-up delay interval, preventing the 'ctrBout' pin 608 of counter 602 from going high, keeping the chip in its initialized state. Thus, while VCC is increasing from zero to its normal operating value, any low going VCC glitches which are less than $T_{warmUpDelay}$ (160 msec in the current example) will not cause chip initialization problems.

The maximum crystal warm-up delay can be quite long, on the order of 0.1 seconds to 0.3 seconds, depending upon the type of crystal being used. Thus an excessive amount of test time would be consumed if the crystal warm-up counter were to be tested in the conventional manner, by allowing it to count through all of its states in real time. The present invention substantially decreases the warm-up counter test time by decomposing the warm-up counter into two or more sub-counters during test mode. For example, the 24 bit counter shown in FIG. 6 can be decomposed into two 12 bit sub-counters. Thus both 12 bit sub-counters can be tested by only traversing $2 * 2^{12}=2^{13}=8,192$ states, compared to traversing $2^{24}$ (~16 million) states for a 24 bit counter. This speeds up the counter test time by a factor of approximately 2,000 times, a very significant improvement. For example, assuming a 50 Mhz crystal clock, the test time for a 24 bit counter can be reduced from 0.32 seconds to only 16 msec. Of course this reduced test time can be reduced even further, if required, by decomposing the counter into more than two pieces during test mode.

Figure 7:
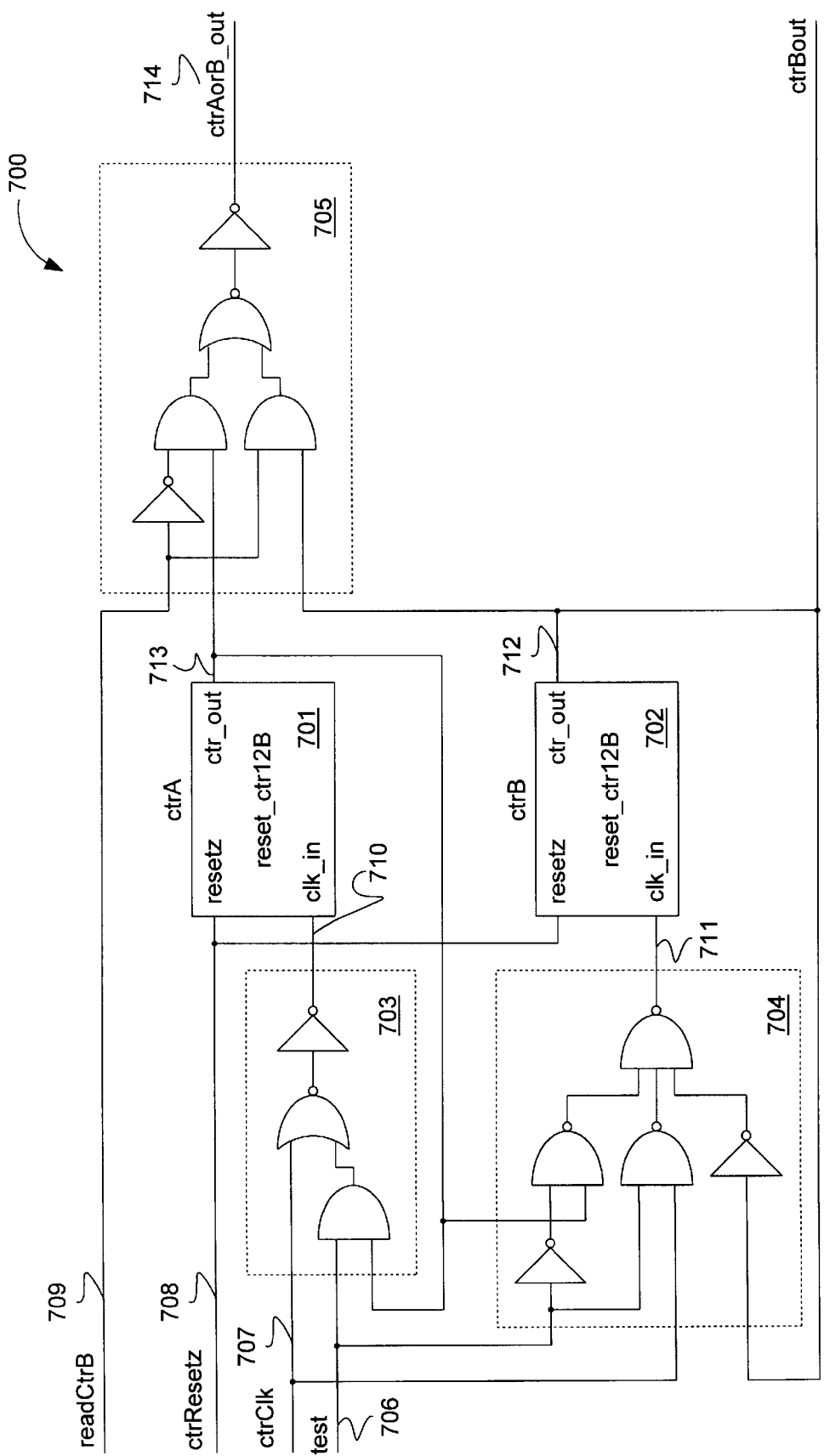
FIG. 7 is a schematic representation of a crystal warm-up counter in accordance with an embodiment of the invention.

FIG. 7 shows a sample embodiment of the 24 bit counter shown in FIG. 6. Those skilled in the art will appreciate that the circuit shown in FIG. 7 is but one possible embodiment of the invention, and that many equivalent embodiments may be employed in practicing the invention.

As shown in FIG. 7, the 24 bit crystal warm-up delay counter has been decomposed into two 12 bit sub-counters, 701 'ctrA', and 702 'ctrB'. During normal (non-test) operation, the logic gates contained in blocks 703 and 704 allow ctrA and ctrB to be connected in series, forming a single 24 bit counter. This 24 bit counter is clocked by the crystal clock input 707 'ctrClk', and all counter bits are initialized by the active low 'ctrResetz' input 708.

In normal (non-test) mode, the ctrB output 712 remains active low during cold initialization, holding the chip in its initialized state. After the crystal warm-up time has expired, the ctrB output 712 will go inactive high, removing the chip initialization signal.

As shown in FIG. 7, test mode is entered by setting the 'test' input signal 706 high. When in test mode, the logic gates contained in blocks 703, 704 and 705 allow ctrA and ctrB to be treated as two independent 12 bit counters clocked by the same input signal, ctrClk 707.

Referring to FIG. 7, during test mode the logic gates shown in block 705 act as a 2:1 multiplexer, allowing the final stage output from ctrA or ctrB to be observed on test output pin 714 'ctrAorBout'. Thus, when the readCtrb input signal 709 is high, 712, the final stage output from ctrB, will be placed onto the test output pin 714. Similarly, when the readCtrb signal 709 is low, 713, the final stage output from ctrA, will be placed onto the test output pin 714.

Figure 8:
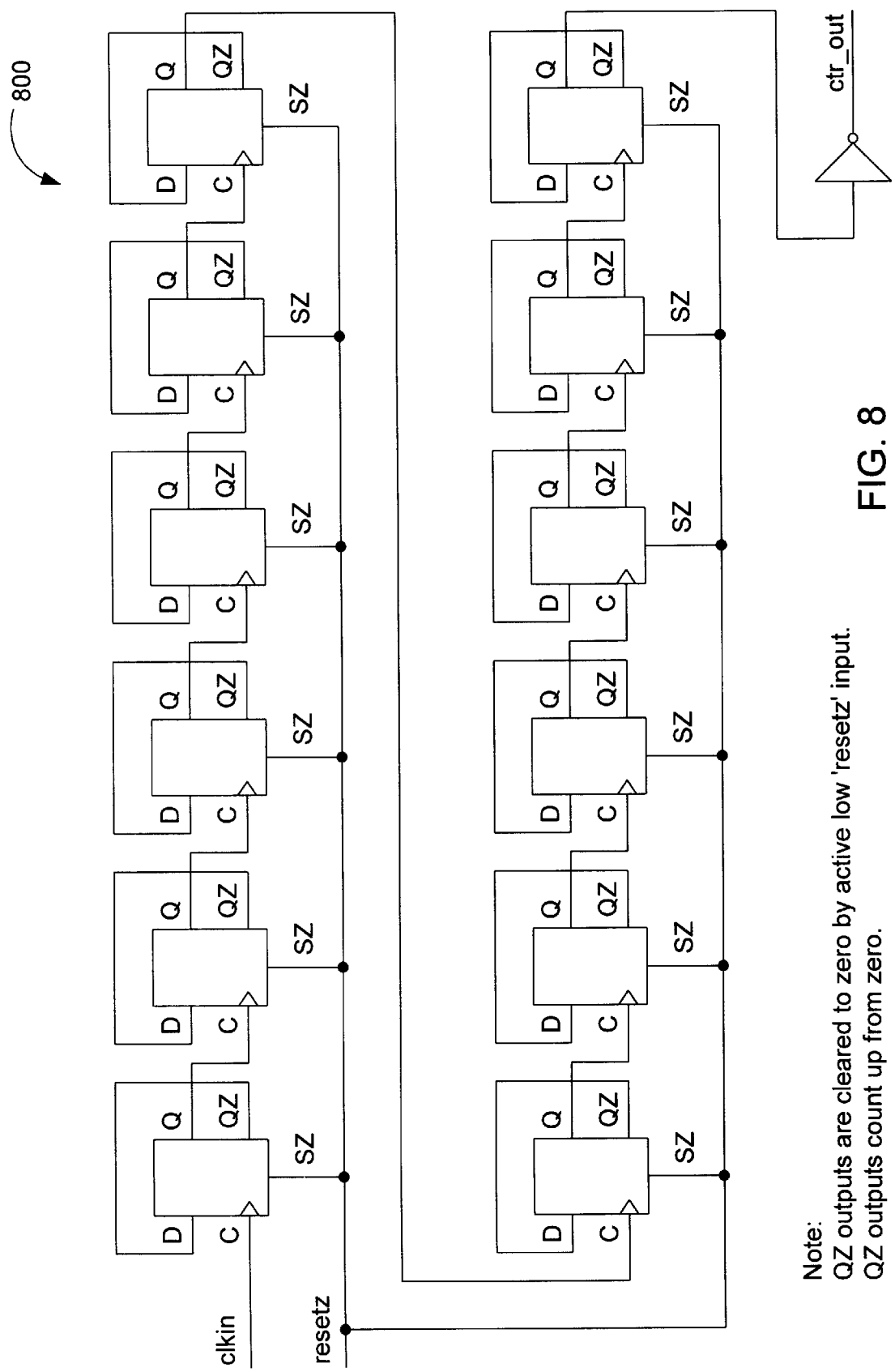
FIG. 8 is a schematic representation of a ripple counter in accordance with an embodiment of the invention.

When in test mode, ctrA and ctrB will count up from zero until they reach their maximum count, at which time they will automatically stop counting. In one embodiment of the invention, ctrA and ctrB can be implemented as simple ripple counters, as shown in FIG. 8.

Figure 9:
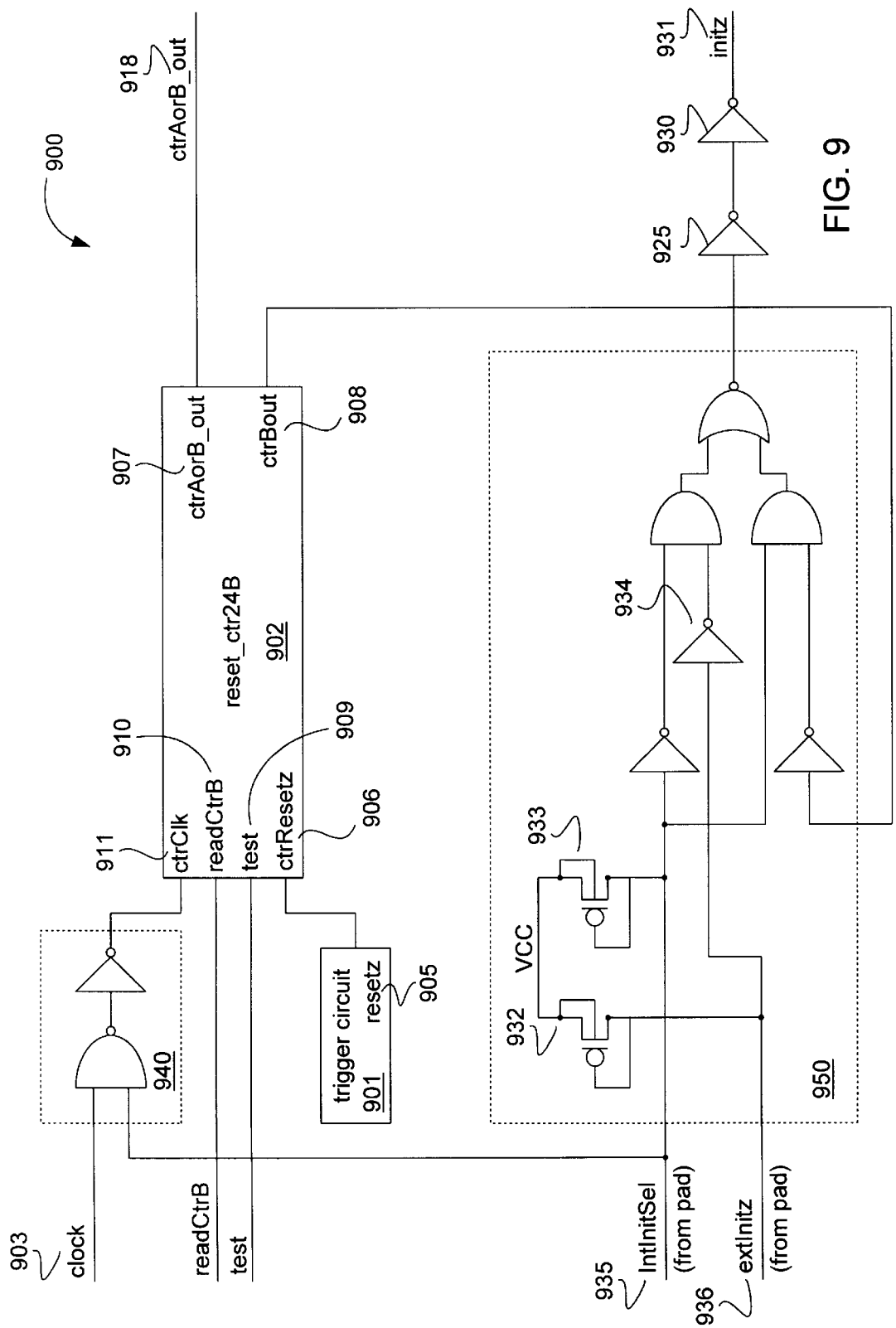
FIG. 9 is a schematic representation of control logic included in an initialization circuit in accordance with an embodiment of the invention.

FIG. 9 is a schematic representation of a power-on initialization circuit 900 in accordance with an embodiment of the present invention. It should be noted that power-on initialization circuit 900 is but one of the many possible embodiments of power-on initialization circuit 100 shown in FIG. 1. Power-on initialization circuit 900 is similar to power-on initialization circuit 600 shown in FIG. 6, and as a result, utilizes the same reference numerals to designate the structures which are common to both circuits.

The circuit shown in FIG. 9 can be used for chips which require internal initialization when in normal operating mode, and external initialization when in test mode. Fast, external test mode initialization is often required for chips such as hard disk controllers and floppy disk controllers, which usually require re-initialization before each new set of test vectors are applied.

Referring to FIG. 9, two additional input signals, 'intInitSel' 935 and 'extInitz' 936, have been added to the circuit shown in FIG. 6. Both of these input signals come from chip input pads.

As shown in FIG. 9, when intInitSel is high, internal initialization mode is selected, and the FIG. 9 circuit essentially behaves the same as the circuit shown in FIG. 6. More specifically, when intInitSel is high, outputs initz 931 and ctrAorB_out 918 behave identically to outputs initz 631 and ctrAorB_out 618 respectively.

Referring to FIG. 9, when intInitSel is low, external initialization mode is selected and the active low initialization signal extInitz 936 is externally supplied from a pad. Since extInitz is externally supplied, chip initialization can be accomplished as often as required during test mode, without having to wait for the crystal warm-up delay to expire during each initialization sequence.

When intInitSel is low, external initialization mode is selected and the 24 bit counter will not count because its clock input ctrClk 911 will be held low. Furthermore, in normal (non-test) operating mode, the pads connected to intInitSel 935 and extInitz 936 can be left floating. This will allow PMOS pull-up resistors 932 and 933 to drive intInitSel and extInitz high, automatically selecting internal initialization mode.

The various circuit arrangements described above have numerous advantages, including the ability to initialize integrated circuits with or without crystal oscillators. In addition, optional test mode capability allows fast testing of the integrated circuits using externally generated test vectors. The described initialization circuit and methods work well with a wide variety of integrated circuits such as microprocessors, complex peripheral chips and the like, fabricated with a wide range of processing technologies.

Although only a few embodiments of the present invention have been described in detail, it should be understood that the invention may be embodied in many other specific forms without departing from the spirit or scope of the invention. For example, it is believed that a wide variety of transistors may be used in addition to the CMOS transistors illustrated.

Additionally, the operating characteristics of the invention can be varied in accordance with the needs of any particular system. Therefore, the described examples are to be considered as illustrative and not restrictive, and the invention is not to be limited to the details given herein, but may be modified within the scope of the appended claims.

What is claimed is:

1. A trigger circuit arranged to provide a reset voltage signal at a trigger circuit output line useful in initializing an integrated circuit connected thereto based upon an input voltage signal received at a trigger circuit input line having an associated input voltage ramp rate indicative of the rate of increase in the input voltage signal from zero to full voltage, the reset voltage signal being ratiometric to the input voltage signal whenever the input voltage signal becomes at least equal to a selectable trip point voltage, comprising:

a first voltage signal generator connected in series between the trigger circuit input line and ground arranged to generate a first voltage signal based upon the input voltage signal having a first voltage signal ramp rate at a first voltage signal generator output line, wherein the first voltage signal generator is a first voltage divider arranged to generate the first voltage signal at a first voltage divider output line, and wherein the first voltage divider is formed of a first PMOS transistor, a second PMOS transistor, and a third PMOS transistor connected in series between the trigger circuit input line and ground;

a second voltage signal generator connected in series between the trigger circuit input line and ground having a second voltage signal generator input line connected to the first voltage signal generator output line arranged to generate a second voltage signal having a second voltage signal ramp rate at a second voltage signal generator output line based upon the first voltage signal, the second voltage signal ramp rate being substantially linear to and greater than the first voltage signal ramp rate;

a reset voltage signal generator connected in series between the trigger circuit input line and ground having a reset voltage signal generator input line connected to the second voltage signal generator output line arranged to generate and output the reset voltage signal at a reset voltage signal generator output line only when the input voltage signal becomes at least approximately equal to the trip point voltage; and an inverting amplifier connected in series between the trigger circuit input line and ground having an inverting amplifier input line connected to the reset voltage signal generator output line arranged to increase a voltage gain of the reset voltage signal at the trip point voltage at the trigger circuit output line so as to improve circuit performance.

2. A trigger circuit as recited in claim 1, wherein the reset voltage signal is an active low voltage signal until the input voltage signal has become at least approximately equal to the trip point voltage.

3. A trigger circuit as recited in claim 2, wherein the second voltage signal generator is a second voltage divider having a second voltage divider input line connected to the first voltage divider output line arranged to generate the second voltage signal at a second voltage divider output line.

4. A trigger circuit as recited in claim 3, wherein the reset voltage signal generator includes a first transistor having first transistor parameters in combination with a second transistor having second transistor parameters, the combination being arranged to convert the second voltage signal to the reset voltage signal at the reset signal generator output line only when the second voltage signal becomes at least approximately equal to the trip point voltage, the reset voltage signal being ratiometric to the input supply voltage thereinafter.

5. A trigger circuit as recited in claim 4, wherein the trip point voltage is based upon the first transistor parameters and the second transistor parameters.

6. A trigger circuit as recited in claim 5, wherein the input voltage signal is an operating supply voltage used to power the integrated circuit generated by an associated power supply.

7. A trigger circuit as recited in claim 6, wherein the integrated circuit is a microprocessor.

8. A trigger circuit as recited in claim 7, wherein the first transistor is a PMOS transistor and the second transistor is a NMOS transistor.

9. An initialization circuit for initializing an integrated circuit whenever the integrated circuit is powered up by an associated power supply, comprising:

a trigger circuit that includes,
a trigger circuit output line,
a first voltage signal generator connected in series between a trigger circuit input line and ground arranged to generate a first voltage signal based upon an input voltage signal having a first voltage signal ramp rate at a first voltage signal generator output line, wherein the first voltage signal generator is a first voltage divider arranged to generate the first voltage signal at a first voltage divider output line, and wherein the first voltage divider is formed of a first PMOS transistor, a second PMOS transistor, and a third PMOS transistor connected in series between the trigger circuit input line and ground, a second voltage signal generator connected in series between the trigger circuit input line and ground having a second voltage signal generator input line connected to the first voltage signal generator output line arranged to generate a second voltage signal having a second voltage signal ramp rate at a second voltage signal generator output line based upon the first voltage signal, the second voltage signal ramp rate being substantially linear to and greater than the first voltage signal ramp rate, a reset voltage signal generator connected in series between the trigger circuit input line and ground having a reset voltage signal generator input line connected to the second voltage signal generator output line arranged to generate and output the reset voltage signal at a reset voltage signal generator output line only when the input voltage signal becomes at least approximately equal to the trip point voltage, and an inverting amplifier connected in series between the trigger circuit input line and ground having an inverting amplifier input line connected to the reset voltage signal generator output line arranged to increase a voltage gain of the reset voltage signal at the trip point voltage at the trigger circuit output line so as to improve circuit performance;

a control logic block having control logic block input lines connected to the trigger circuit output line and external circuitry, the control logic block being arranged to output, control logic signals, a reset voltage signal at control logic block output lines based upon initialization circuit control signals received from the external circuitry at the control logic block input lines;

a synchronous component reset signal used to reset a synchronous component included in the integrated circuit, and an asynchronous component reset signal used to reset a asynchronous component included in the integrated circuit.

10. An initialization circuit as recited in claim 9, wherein a delayed reset signal is formed by delaying the reset voltage signal by a period of time at least substantially equal to a crystal warm-up delay interval associated with a crystal oscillator circuit included in the integrated circuit.

11. An initialization circuit as recited in claim 10, wherein the trigger circuit includes a counter circuit arranged to receive the reset voltage and crystal oscillator circuit output signals and output the reset voltage only after determining that the crystal oscillator has generated a pre-determined number of valid output signals.

12. An initialization circuit as recited in 11, wherein the counter circuit includes:

a selectable first twelve bit counter arranged to receive the reset voltage signal and crystal oscillator circuit signals at first counter input lines; and a selectable second twelve bit counter connected in series with the first twelve bit counter, wherein the first twelve bit counter outputs the reset voltage signal to the second twelve bit counter only when the first twelve bit counter has received at least $2^{12}$ consecutive valid output signals from the crystal oscillator circuit, and wherein the second twelve bit counter circuit outputs the reset voltage signal received from the first twelve bit counter to the synchronous component reset signal output line only after the second twelve bit counter has received at least another $2^{12}$ consecutive valid output signals from the crystal oscillator circuit.

13. An initialization circuit as recited in claim 12, wherein the crystal warm-up delay interval is at most approximately 335 ms at 50 MHz.

14. A method of powering up an integrated circuit by a power supply using an initialization circuit connected to the power supply, the initialization circuit having a trigger circuit connected to a logic control block, comprising:

the trigger circuit converting a power supply voltage from the power supply to a reset voltage signal based upon a trip point voltage and the reset voltage signal being ratiometric to the power supply voltage thereinafter, the power supply voltage used in the operation of the integrated circuit having a ramp rate indicative of the rate of increase in the power supply voltage from zero to full voltage, wherein the trigger circuit includes a trigger circuit output line, a first voltage signal generator connected in series between a trigger circuit input line and ground arranged to generate a first voltage signal based upon an input voltage signal having a first voltage signal ramp rate at a first voltage signal generator output line, wherein the first voltage signal generator is a first voltage divider arranged to generate the first voltage signal at a first voltage divider output line, and wherein the first voltage divider is formed of a first PMOS transistor, a second PMOS transistor, and a third PMOS transistor connected in series between the trigger circuit input line and ground, a second voltage signal generator connected in series between the trigger circuit input line and ground having a second voltage signal generator input line connected to the first voltage signal generator output line arranged to generate a second voltage signal having a second voltage signal ramp rate at a second voltage signal generator output line based upon the first voltage signal, the second voltage signal ramp rate being substantially linear to and greater than the first voltage signal ramp rate, a reset voltage signal generator connected in series between the trigger circuit input line and ground having a reset voltage signal generator input line connected to the second voltage signal generator output line arranged to generate and output the reset voltage signal at a reset voltage signal generator output line only when the input voltage signal becomes at least approximately equal to the trip point voltage, and an inverting amplifier connected in series between the trigger circuit input line and ground having an inverting amplifier input line connected to the reset voltage signal generator output line arranged to increase a voltage gain of the reset voltage signal at the trip point voltage at the trigger circuit output line so as to improve circuit performance;

outputting a synchronous component reset signal from the control logic block based upon control signals received from external circuitry when the integrated circuit includes an on-chip crystal oscillator used to provide clock signals to synchronous components included in the integrated circuit;

outputting a test signal from the control logic block based upon control signals received from external circuitry, the test signal being based upon test vectors received from external circuitry and used to evaluate functionality of selected components included in the integrated circuit; and outputting an asynchronous component reset signal from the control logic block based upon control signals received from external circuitry when the integrated circuit does not include an on-chip crystal oscillator.

15. A method of powering up an integrated circuit as recited in claim 14, wherein the synchronous component reset signal is the reset voltage delayed by a period of time at least as long as a crystal warm-up interval associated with the on-chip crystal oscillator.

16. A method of powering up an integrated circuit as recited in claim 15, wherein the asynchronous reset signal is substantially the reset voltage signal.

17. A method of powering up an integrated circuit as recited in claim 16, wherein the outputting a synchronous initialization signal further includes generating an appropriately delayed synchronous signal when it is determined that the integrated circuit includes an on-chip crystal oscillator.

* * * * *